US009620597B2

(12) United States Patent
Tzeng et al.

(10) Patent No.: US 9,620,597 B2
(45) Date of Patent: Apr. 11, 2017

(54) GRAPHENE OPTOELECTRONIC DETECTOR AND METHOD FOR DETECTING PHOTONIC AND ELECTROMAGNETIC ENERGY BY USING THE SAME

(71) Applicant: National Cheng Kung University, Tainan (TW)

(72) Inventors: Yon-Hua Tzeng, Tainan (TW); Chun-Cheng Chang, Changhua County (TW); Pin-Yi Li, Taipei (TW); Yueh-Chieh Chu, Tainan (TW)

(73) Assignee: NATIONAL CHENG KUNG UNIVERSITY, Taiwan (CN)

( * ) Notice: Subject to any disclaimer, the term of this patent is extended or adjusted under 35 U.S.C. 154(b) by 133 days.

(21) Appl. No.: 14/751,738

(22) Filed: Jun. 26, 2015

(65) Prior Publication Data

US 2016/0190257 A1   Jun. 30, 2016

(30) Foreign Application Priority Data

Dec. 25, 2014 (TW) .............................. 103145427 A

(51) Int. Cl.
*G01J 1/42* (2006.01)
*H01L 29/16* (2006.01)
(Continued)

(52) U.S. Cl.
CPC ........ *H01L 29/1606* (2013.01); *H01L 31/028* (2013.01); *H01L 31/0224* (2013.01); *H01L 31/09* (2013.01); *H01L 29/08* (2013.01)

(58) Field of Classification Search
CPC .......................... H01L 31/028; H01L 29/1606
See application file for complete search history.

(56) References Cited

U.S. PATENT DOCUMENTS

2011/0042650 A1* 2/2011 Avouris .............. H01L 29/1606
                                                                257/29
2012/0001761 A1   1/2012 Voutilainen et al.
2014/0319357 A1   10/2014 Ogawa et al.

FOREIGN PATENT DOCUMENTS

CN   103633183 A   3/2014
CN   103811568 A   5/2014
(Continued)

OTHER PUBLICATIONS

Yonhua Tzeng and Chuncheng Chang, Photodetectors Based on Negative Photoconductivity of CVD Graphene, Jul. 2014, Institute of Microelectronics, College of Electrical Engineering and Computer Science, Taiwan.

*Primary Examiner* — Thanh Luu
(74) *Attorney, Agent, or Firm* — Bacon & Thomas, PLLC

(57) ABSTRACT

A graphene optoelectronic detector is disclosed, which comprises: an insulating substrate with a graphene layer disposed thereon; a first electrode disposed on the graphene layer or between the graphene layer and the insulating substrate; and a second electrode disposed on the graphene layer or between the graphene layer and the insulating substrate, wherein there is a predetermined distance between the first electrode and the second electrode, and the first electrode and the second electrode are at different electrical potentials, wherein a high-drift carrier moving region is disposed between the first electrode and the second electrode, and a low-drift carrier moving region is disposed outside the high-drift carrier moving region. In addition, the present invention further provides a method for detecting photons and electromagnetic energy using the aforementioned graphene detector.

17 Claims, 8 Drawing Sheets

(51) Int. Cl.
*H01L 31/028* (2006.01)
*H01L 31/0224* (2006.01)
*H01L 31/09* (2006.01)
*H01L 29/08* (2006.01)

(56) References Cited

FOREIGN PATENT DOCUMENTS

| | | | |
|---|---|---|---|
| CN | 103887352 | A | 6/2014 |
| CN | 103956402 | A | 7/2014 |
| KR | 20140056670 | A | 5/2014 |
| KR | 20140091812 | A | 7/2014 |
| TW | 201244070 | A | 11/2012 |
| WO | 2014117314 | A | 8/2014 |

* cited by examiner

GRAPHENE OPTOELECTRONIC DETECTOR AND METHOD FOR DETECTING PHOTONIC AND ELECTROMAGNETIC ENERGY BY USING THE SAME

CROSS REFERENCE TO RELATED APPLICATION

This application claims the benefits of the Taiwan Patent Application Serial Number 103145427, filed on Dec. 25, 2014, the subject matter of which is incorporated herein by reference.

BACKGROUND OF THE INVENTION

1. Field of the Invention

The present invention is related to an optoelectronic detector and a method for detecting photonic and electromagnetic energy by using the same and, more particularly, to a graphene optoelectronic detector with improved detection effect of photonic and electromagnetic energy and a method for detecting photonic and electromagnetic energy by using the same.

2. Description of Related Art

Graphene is a two-dimensional honey-comb lattice of sp2-bonded carbon atoms, and has extreme thin thickness, high mechanical strength and extreme high conductivity (5300 W/m·K). In addition, the electron mobility of the graphene is 15,000 $cm^2/V·s$ or more at room temperature, which is more than tenfold of the conventional Si material (~1,400 $cm^2/V·s$). Furthermore, the transmittance of the graphene is 97% or more, and thus the graphene is considered as a novel transparent conductive material. However, since the light absorption rate of a monolayer graphene is less than 3%, it is not a suitable material for a positive photoconductive optoelectronic detector which is performed by exciting photons to increase conductivity thereof.

The graphene has the aforementioned excellent optical, electrical and mechanical features as well as high transmittance, so there are many studies and developments related to the graphene. For example, the applications of the graphene may comprise transistors, super capacitors, Li batteries, solar cells and transparent conductive electrodes.

In addition, compared to the expensive ITO or other sensing material such as GaN and AlGaAs, the graphene is characterized to have thin thickness, high conductivity and specific band structure. Graphene has a thickness of a monolayer and low cost. Hence, the graphene is developed to substitute conventional sensing materials.

Therefore, it is desirable to provide an optoelectronic detector using graphene, which is different from the conventional positive photoconductive optoelectronic detector, wherein the conventional sensing material is replaced by the graphene to achieve the purpose of good sensing effect and low manufacturing cost.

SUMMARY OF THE INVENTION

The object of the present invention is to provide a graphene optoelectronic detector and a method for detecting photonic and electromagnetic energy by using the same. Herein, the graphene optoelectronic detector of the present invention is characterized by having a high-drift carrier moving region and a low-drift carrier moving region; therefore, when photonic and electromagnetic energy is applied onto the graphene optoelectronic detector, depending on the applied location, the photonic and electromagnetic energy may cause charge carriers to be transferred by carrier-carrier scattering in real space, unlike intervalley scattering in the momentum-space (K-space) in some semiconductors, between two real-space regions, where charge carriers move at different speeds. For example, charge carriers in a high-drift carrier moving region can be transferred to another low-drift carrier moving region, resulting in a reduction of the total electrical conductivity for both the high-drift and low-drift carrier moving regions, in the form of a negative differential photoconductivity, i.e., electrical conductivity without applied photonic and electromagnetic energy is higher than the electrical conductivity with applied photonic and electromagnetic energy, to achieve the purpose of detecting the photonic and electromagnetic energy.

The present invention provides a graphene optoelectronic detector, which comprises: an insulating substrate with a graphene layer disposed thereon; a first electrode disposed on the graphene layer or between the graphene layer and the insulating substrate; and a second electrode disposed on the graphene layer or between the graphene layer and the insulating substrate, wherein there is a predetermined distance between the first electrode and the second electrode, and the first electrode and the second electrode have different electrical potentials. Herein, a high-drift carrier moving region is disposed between the first electrode and the second electrode, and a low-drift carrier moving region is disposed outside the high-drift carrier moving region.

The present invention also provides a method for detecting photonic and electromagnetic energy using the aforementioned graphene optoelectronic detector, which comprises the following steps: providing the aforementioned graphene optoelectronic detector; applying photonic and electromagnetic energy onto the high-drift carrier moving region, wherein charge carriers in the high-drift carrier moving region scatter to the low-drift carrier moving region to obtain a decreased current value between the first electrode and the second electrode; and detecting and calculating the decreased current value to obtain an amount of the photonic and electromagnetic energy.

In the graphene optoelectronic detector and the method of the present invention, the structures of and the distance between the first electrode and the second electrode are not particularly limited, as long as the first electrode and the second electrode are separated in a predetermined distance so that charge carriers in the high-drift carrier moving region can scatter to the low-drift carrier moving region. The predetermined distance is preferably in a range from 1 µm to 1000 µm, more preferably in a range from 5 µm to 200 µm, and most preferably in a range from 10 µm to 40 µm. If the predetermined distance is too short, when photonic and electromagnetic energy are applied onto the high-drift carrier moving region, the charge carriers receiving the energy may directly move from the first electrode to the second electrode through the high-drift carrier moving region, because the space between the first electrode and the second electrode is not large enough for the charge carriers receiving the energy to scatter to the low-drift carrier moving region. If the predetermined distance is too long, the transition from the high-drift carrier moving region to the low-drift carrier moving region is slow causing the moving rate of the charge carriers from the high-drift region to the low-drift region to decrease. When photonic and electromagnetic energy are applied onto the high-drift carrier moving region, the current change between the first electrode and the second electrode is not significant enough due to the decreased moving rate of the charge carriers, and therefore the purpose of obtaining high response for detecting the energy cannot be achieved.

In one aspect of the present invention, the first electrode may further comprise a first extension portion, the second electrode may further comprise a second extension portion, the first extension portion extends from the first electrode toward the second electrode, the second extension portion extends from the second electrode toward the first electrode, and the predetermined distance is between the first extension portion and the second extension portion.

In the graphene optoelectronic detector and the method of the present invention, the graphene layer is preferably a monolayer graphene layer or a stack of multiple layers of graphene.

In the graphene optoelectronic detector and the method of the present invention, the photonic and electromagnetic energy to be detected is not particularly limited, and can be light, electricity and magnetic field. The specific examples of the photonic and electromagnetic energy comprises: infrared, visible light, UV light, electromagnetic radiation, extreme UV light, high-level radiation, or magnetic field.

In the graphene optoelectronic detector and the method of the present invention, the graphene layer can be selectively patterned to make the moving rate difference of the charge carriers in the high-drift carrier moving region and the low-drift carrier moving region more significantly. For example, in one aspect, the graphene layer is a patterned graphene layer, which comprises: a connection portion for connecting the first electrode and the second electrode, and at least one lateral extension portion, wherein an extension direction of the lateral extension portion intersects a longitudinal direction of the connection portion, and a width of the connection portion is smaller than those of the first electrode and the second electrode. Alternatively, in another aspect, at least one recess is further disposed in the graphene layer, which locates around the first electrode and the second electrode but does not locate on the high-drift carrier moving region between the first electrode and the second electrode. However, the present invention is not limited thereto, as long as the graphene layer between the first electrode and the second electrode can generate the high-drift carrier moving region and the low-drift carrier moving region.

As mentioned above, in the graphene optoelectronic detector and the method of the present invention, the high-drift carrier moving region between the first electrode and the second electrode can be generated and the low-drift carrier moving region can also be generated outside the high-drift carrier moving region by disposing the graphene layer. When photonic and electromagnetic energy are applied onto the high-drift carrier moving region, the moving of the charge carriers are influenced by the applied energy and thus the charge carriers scatter from the high-drift carrier moving region to the low-drift carrier moving region. Therefore, the current change or the charge change between the first electrode and the second electrode can be measured to obtain the purpose of detecting the applied energy.

The method of the present invention is not limited to the scatter of charge carriers from a high-drift region to a low-drift region. It can also be applied to the scatter of charge carriers from a low-drift region to a high-drift region.

The charge carrier concentration in the high-drift carrier moving region and the low-drift carrier moving region of the graphene optoelectronic detector of the present invention may be varied by the known field effect modulation of carrier concentration, wherein the graphene layer is disposed with a dielectric layer and a gate electrode with a voltage applied thereto. A higher voltage can be applied between two electrodes to increase current amount therebetween. The voltage applied between the two electrodes can be from several milli-Vs (mVs) to multiple Vs, and can be adjusted according to the sizes and the shapes of the two electrodes. Herein, the amount of the applied voltage is limited to that the current density passing through the graphene layer is not too high to overheat or destroy the graphene layer.

Other objects, advantages, and novel features of the invention will become more apparent from the following detailed description when taken in conjunction with the accompanying drawings.

BRIEF DESCRIPTION OF THE DRAWINGS

FIGS. 7($b$) to 7($f$) are schematic views showing moving of charge carriers when photonic and electromagnetic energy is applied onto a graphene optoelectronic detector according to Embodiment 3 of the present invention;

FIG. 8($b$) is a schematic view showing moving of charge carriers when photonic and electromagnetic energy is applied onto a graphene optoelectronic detector according to Embodiment 3 of the present invention.

DETAILED DESCRIPTION OF THE PREFERRED EMBODIMENT

Figure 1:
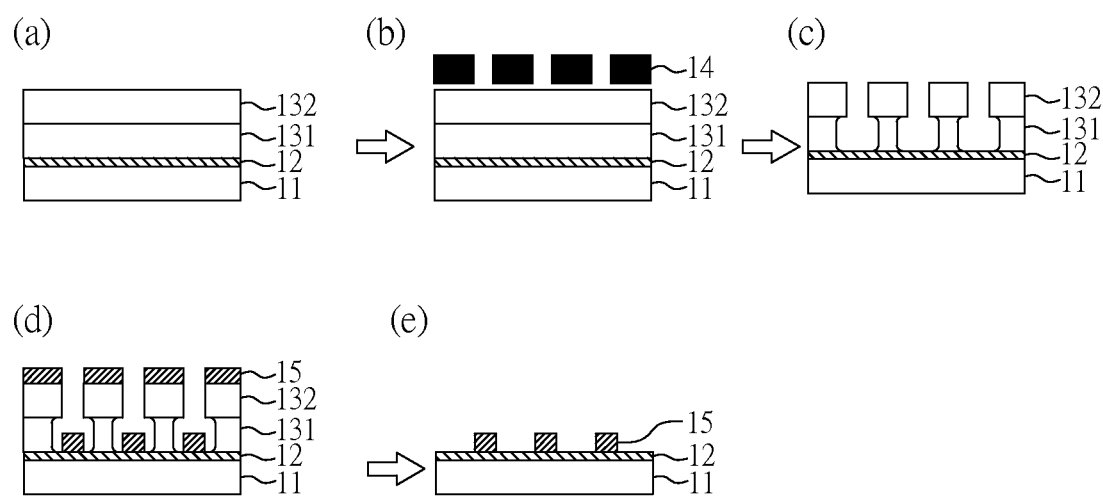
FIG. 1 is a cross-sectional view showing a manufacturing process of a graphene optoelectronic detector according to Embodiment 1 of the present invention.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

In the present embodiment, the graphene was growth by using a copper film (from Alfa Aesar, purity of 99.8%, thickness of 0.025 mm). First, the copper film was cleaned by immersing in an acetone solution, followed by ultra-sonication for 15 min. Next, the acetone solution was replaced by iso-propanol alcohol, and the copper film was further cleaned by ultra-sonication for another 15 min. In the present invention, the method for cleaning the copper film suitable for the present invention is not limited to the aforementioned process. Then, a thermal chemical vapor deposition was performed to grow a graphene layer on the copper film.

Herein, the cleaned copper film was disposed on a quartz holder in a furnace, and a mechanical pump was used to reduce the chamber pressure to less than $4 \times 10^{-2}$ Torr, followed by using a turbo molecular pump to create a vacuum. When a high vacuum was achieved, the air evacuation valve was closed, followed by closing the turbo molecular pump. Next, 4 sccm $H_2$ was introduced into the chamber until the pressure therein was greater than 0.5 Torr, the air evacuation valve was switched on, and gas was exhausted by using the mechanical pump. Then, 4 sccm $H_2$ was continuously introduced therein, the inner pressure of the chamber was set to be 0.1 Torr, and the temperature of the chamber was increased by two steps. The first step was set to heat to 800° C. within 30 min, and the second step was set to heat to a temperature for growing graphene (~1030° C.) within 30 min. After the temperature was maintained for 30 min, a magnetically controllable robot was used to put the copper foil into the furnace, and the temperature was maintained at 1030° C. to perform the annealing process for 60 min. Next, 10 sccm $CH_4$, 2 sccm $H_2$ and 1000 sccm Ar was introduced therein, and graphene was growth under 3.94 Torr, at 1030° C. for 20 min. Then, the introduction of the gas was stopped, and the copper foil was removed from the furnace by the magnetically controllable robot to rapidly reduce the temperature thereof to accomplish the process for manufacturing the graphene of the present embodiment. Herein, the aforementioned process is only one preferred process for preparing the graphene, but the present invention is not limited thereto.

Next, the obtained graphene was transferred onto an insulating substrate. Herein, the method for transferring the graphene is not particularly limited, and the graphene can be transferred by any known process used in the art.

In the present embodiment, the copper foil with monolayer graphene layers formed thereon was placed onto a coating machine, and coated with resin s1818, to obtain a resin/graphene/copper foil/graphene structure. Next, a mixing solvent of $HNO_3$, $H_2O_2$ and DI water (1:1:2) was used to remove the bottom of the copper foil, and the graphene layer under the copper foil was also removed. The sample was put into DI water for cleaning, and then the copper foil covered with resin and graphene on only one side thereof was obtained (resin/graphene/copper foil). Then, the copper foil was put on a surface of a $(NH_4)_2S_2O_8$ solution, and the side of the copper foil without the resin formed thereon was faced thereto. After copper was completely removed, the sample was cleaned with DI water. The floating resin/graphene film on the DI water was taken out with an insulating substrate, and the resin on the graphene layer was removed with acetone to finish the graphene transferring process.

After the aforementioned graphene transferring process, a structure of FIG. 1(a) was obtained, wherein a graphene layer 12 is formed on an insulating substrate 11, and the graphene layer 12 is a monolayer graphene layer.

Next, a photolithography process and a sputtering process were used to prepare electrodes. The process for preparing the electrodes is not particularly limited, and can be any known process in the art.

In the present embodiment, as shown in FIG. 1(a), a first resin layer 131 was made of resin SF6. After the sample was exposed without using a mask, a second resin layer 132 made of resin I123 was formed thereon. Next, the lithography system (SUSS Micro Tech MJB3 Mask Aligner) and the deep ultraviolet (DUV) light source (365 nm) were used for the exposure process. As shown in FIG. 1(b), after the sample was exposed by using a mask 14 for a predetermined time and developed with a developer AZ300K, a patterned resin 132 can be obtained, as shown in FIG. 1(c).

Next, the sample was placed in a magnetron sputtering system, an Au target was placed therein, and the pressure of the chamber was reduced to $10^{-6}$ Torr. Then, Ar was introduced into the chamber to increase the pressure thereof to $2 \times 10^{-2}$ Torr, the working power was 60 W, the sputtering time was 12 min, and an Au electrode 15 having a thickness of about 100 nm was obtained, as shown in FIG. 1(d). Finally, the first resin layer 131 and the second resin layer 132 were removed, and thus the graphene optoelectronic detector of the present embodiment was obtained, as shown in FIG. 1(e). Herein, the material for the electrode 15 is not limited to Au, as long as the metal (for example, Pd and Ti) and other non-metal conductive material (for example, graphite and high conductivity Si) having low energy gap and low resistance with graphene can be used as the electrode material for connecting with the measuring circuit of the detector of the present invention.

As shown in FIG. 1(e), the graphene optoelectronic detector of the present embodiment comprises: an insulating substrate 11 with a graphene layer 12 disposed thereon; and plural electrodes 15 disposed on the graphene layer 12. In the present embodiment, the electrodes 15 have sizes of 400 μm×400 μm, and a distance between two electrodes 15 is 20 μm. Hereinafter, the mechanism of the graphene optoelectronic detector of the present embodiment is illustrated below.

As shown in FIG. 2(a), the electrodes 15 of the graphene optoelectronic detector of the present embodiment comprise: a first electrode 151 and a second electrode 152, wherein there is a predetermined distance between the first electrode 151 and the second electrode 152. When the graphene optoelectronic detector of the present embodiment electrically connects to a power supply (not shown in the figure), the first electrode 151 and the second electrode 152 are at different electrical potential. In addition, a high-drift carrier moving region 12a is disposed between the first electrode 151 and the second electrode 152, and a low-drift carrier moving region 12b is disposed outside the high-drift carrier moving region 12a. When a bias voltage is provided to the first electrode 151 and the second electrode 152, the moving directions of the charge carries in the high-drift carrier moving region 12a and the low-drift carrier moving region 12b are indicated by arrows shown in FIG. 2(a)-(c).

Figure 3:
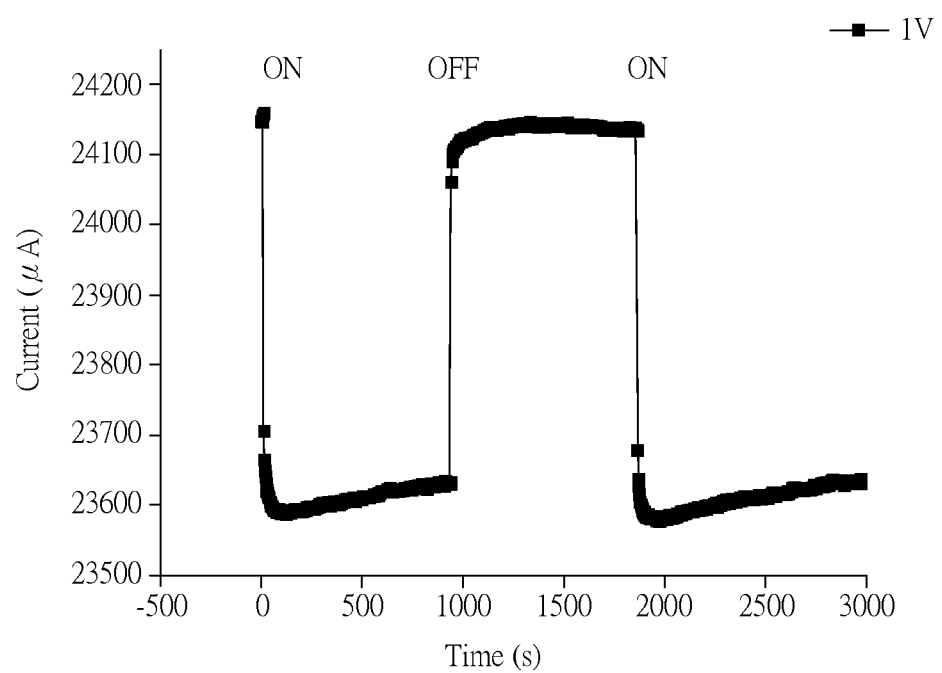
FIG. 3 shows a result that a graphene optoelectronic detector according to Embodiment 1 of the present invention illuminated with and without light.

As shown in FIG. 3, when a 1V bias was applied to the graphene optoelectronic detector of the present embodiment, blue light (405 nm, 68 mW) was applied onto the graphene optoelectronic detector and a current detector (not shown in the figure) was used to measure the current change. In the cases of illumination (ON) and non-illumination (OFF), a steady current can be significantly detected. This result indicates that the graphene optoelectronic detector of the present embodiment can be used to detect visible light.

Figure 2:
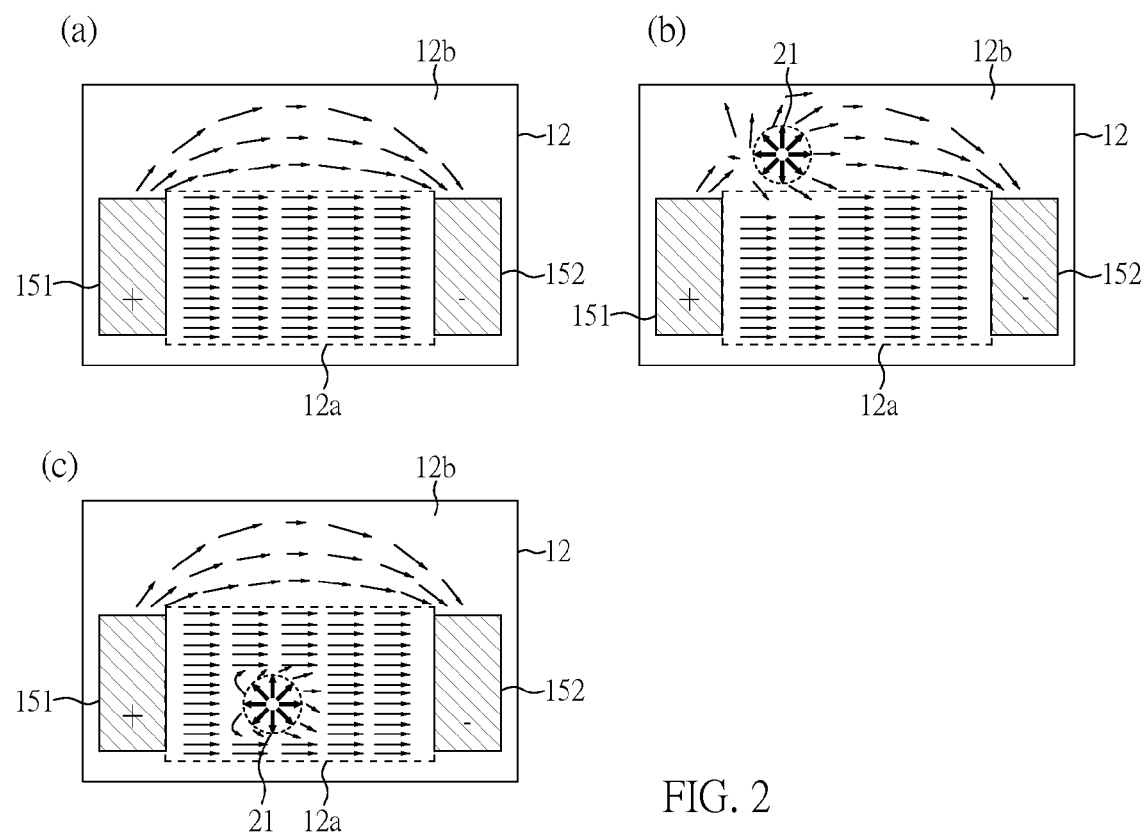
FIG. 2 is a top view of a graphene optoelectronic detector according to Embodiment 1 of the present invention.
Figure 4:
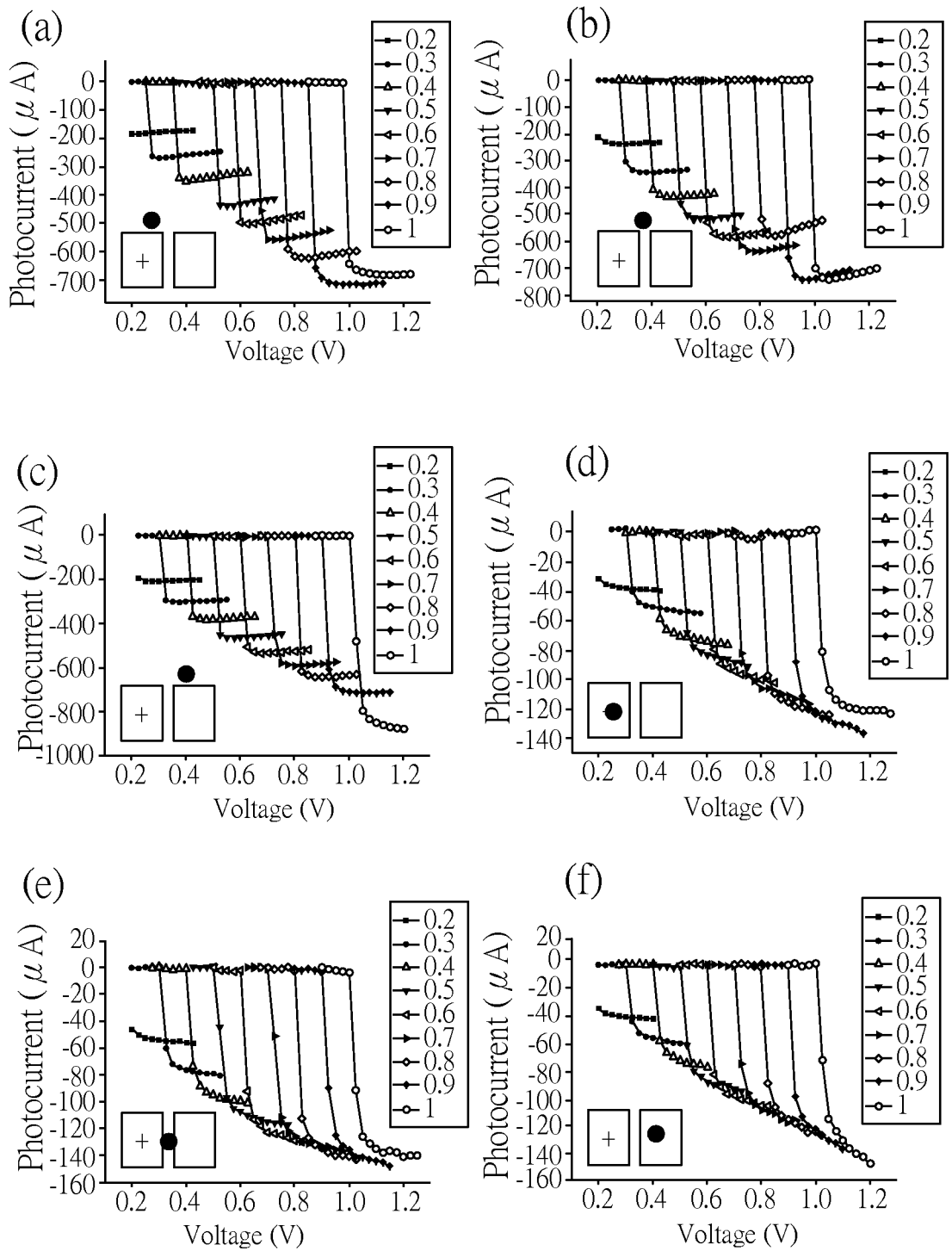
FIG. 4 is a graph showing a photocurrent change when photonic and electromagnetic energy is applied onto various positions of a graphene optoelectronic detector according to Embodiment 1 of the present invention.

Herein, the blue light was also applied onto different positions of the graphene optoelectronic detector of the present invention, to understand the relation between the current changes and the positions that the energy applied thereon. As shown in FIGS. 2 and 4, when a 0.2-1 V bias was applied to the graphene optoelectronic detector of the present embodiment, blue light (405 nm, 68 mW) was applied onto the graphene optoelectronic detector and a current detector (not shown in the figure) was used to measure the current change. As shown in FIG. 4 (a)-(c), when the laser light was applied at the interface between the electrodes and the graphene, a photovoltaics effect can be observed. However, this photovoltaics effect did not occur at the position away from the interface, because the electron-hole pairs did not separate due to the specific electric field direction. As shown in FIG. 4, when the bias of 0.2V or more was applied, the charge carriers in the high-drift carrier moving region scattered to the low-drift carrier moving region, resulting in the reduced current. This reduced current was much larger than the positive photocurrent generated due to the photovoltaics effect, so only the differential negative photocurrent can be observed. As shown in FIG. 4(a)-(c), the electric field is relative high at the interface between the electrodes and the graphene, and the intensity of the electric field changes greatly and rapidly as the position thereof changed; therefore, large amount of the charge carriers scatters and transfers from the high-drift carrier moving region to the low-drift carrier moving region, and the change of the drift rate of the charge carriers is large. In addition, the charge carriers scattered to the low-drift carrier moving region cannot easily return to the high-drift carrier moving region due to the distribution of the electric field, so large reduced current can be measured after illumination. On the contrary, as shown in FIG. 4(d)-(f), when the light is not applied at the interface of the electrodes and the graphene, the drift rate of the charge carriers around the illumination region is small, and the change of the drift rate thereof causing by scattering is also small, because the electric field is relatively uniform. Hence, compared to the results shown in FIG. 4(a)-(c), the changes of the current shown in FIG. 4(d)-(f) are relatively small. In particular, as shown in FIG. 4(c), when the applied voltage is increased to 1V, a negative photocurrent response (about 1 mA) can be observed at the interface of the electrodes and the graphene after illumination.

As shown in FIG. 2(a), when a bias is applied to the first electrode 151 and the second electrode 152, a steady and uniform high electric field (i.e. the high-drift carrier moving region 12a of the present invention) is generated between the first electrode 151 and the second electrode 152, but a low electric field in which the density of the electric field lines is low and inversely proportional to the distance from the electrodes (i.e. the low-drift carrier moving region 12b of the present invention) is generated at upper and bottom sides of the first electrode 151 and the second electrode 152. Hence, in the case that a laser light is applied at the upper side of the first electrode 151 and the second electrode 152 when a bias is applied to the first electrode 151 and the second electrode 152, as shown in FIG. 2(b), the hot carriers generated by the charge carriers obtaining the photonic and electromagnetic energy 21 (i.e. the laser light used in the present embodiment) may interact with surrounding charge carriers during the process that the hot carriers return to the ground state. For the charge carries on the graphene layer 12, the hot carriers can be considered as scattering promoters, and the scattering opportunity between charge carriers may be increased. In addition, comparing with the uniform high electric field locating at the center region between two electrodes, the electric filed is weak and not uniform and the electric field density thereof is low at the upper and bottom sides of the two electrodes. Hence, the scattered charge carriers at the upper side of the electrode are difficult to return to the original current path; therefore, the mobility of the charge carriers is reduced, resulting in a significant negative photoconductivity. When the photonic and electromagnetic energy 21 (i.e. the laser light used in the present embodiment) is applied between two electrodes, as shown in FIG. 2(c), since a uniform and high electric field with high current density is generated between two electrodes, the scattered charge carriers maintain in the region having high electric field and easily return to the original current path; therefore, the significant negative photoconductivity observed in the situation shown in FIG. 2(b) cannot be observed in the case shown in FIG. 2(c).

Hence, in the graphene optoelectronic detector of the present embodiment, as shown in FIG. 2, the charge carriers in the high-drift carrier moving region 12a scatter to the low-drift carrier moving region 12b after receiving the energy, resulting in the current value between the first electrode 151 and the second electrode 152 decreased. Therefore, by detecting and calculating the decreased current value, an amount of the applied photonic and electromagnetic energy can be obtained, and the purpose of detecting the photonic and electromagnetic energy can be achieved.

Embodiment 2

Figure 5:
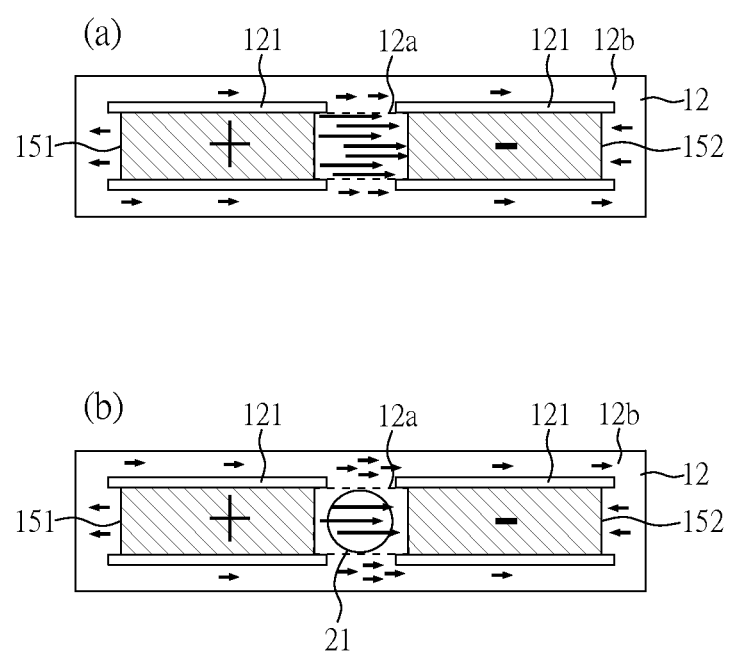
FIG. 5 is a top view of a graphene optoelectronic detector according to Embodiment 2 of the present invention.

The structure and the manufacturing process of the graphene optoelectronic detector of the present embodiment are similar to those illustrated in Embodiment 1, except that in the graphene optoelectronic detector of the present embodiment, at least one recess 121 is further disposed in the graphene layer 12, which locates around the first electrode 151 and the second electrode 152 but does not locate on the high-drift carrier moving region 12a between the first electrode 151 and the second electrode 152, as shown in FIG. 5. Herein, when a photonic and electromagnetic energy 21 is applied onto the high-drift carrier moving region 12a, the charge carrier at the high-drift carrier moving region 12a may scatter to the low-drift carrier moving region 12b, resulting in the current change between the first electrode 151 and the second electrode 152.

Embodiment 3

Figure 6:
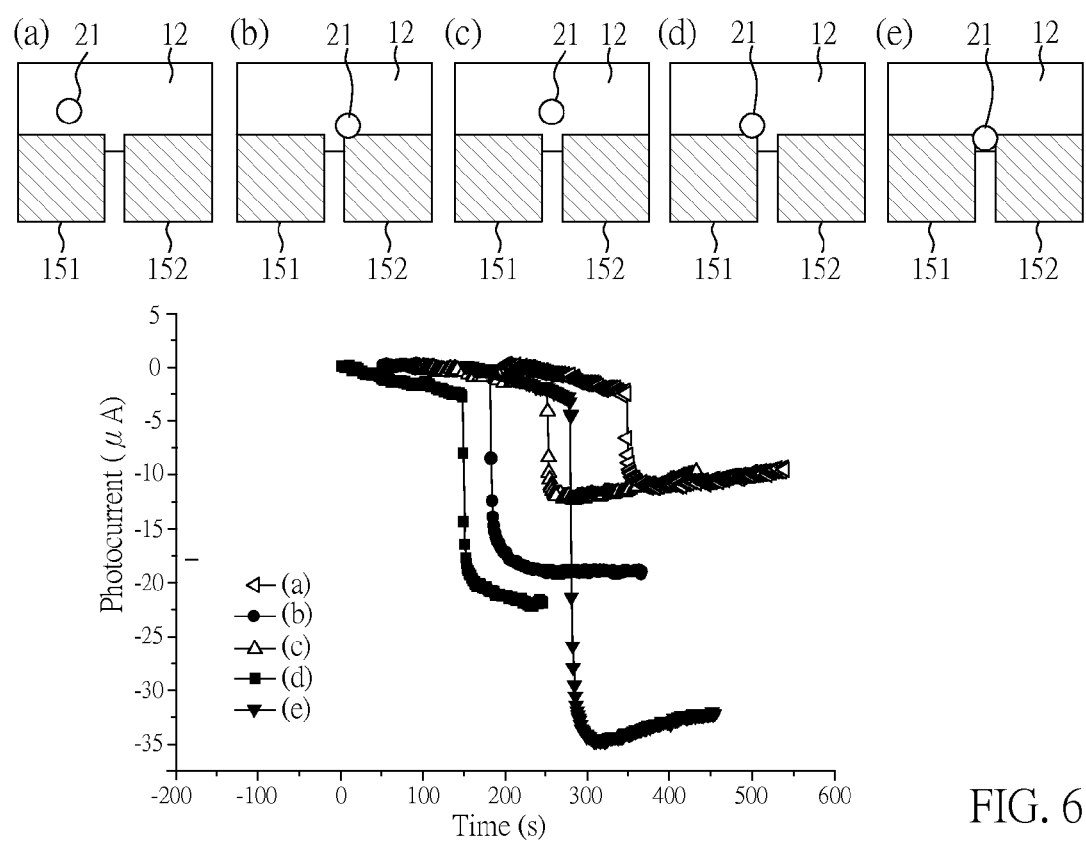
FIG. 6 is a top view of a graphene optoelectronic detector according to Embodiment 3 of the present invention, and a graph showing a photocurrent change when photonic and electromagnetic energy is applied on various positions thereof.

The structure and the manufacturing process of the graphene optoelectronic detector of the present embodiment are similar to those illustrated in Embodiment 1, except that in the graphene optoelectronic detector of the present embodiment, the graphene layer 12 is not disposed around the whole peripheries of the first electrode 151 and the second electrode 152, and only disposed at the same sides of the first electrode 151 and the second electrode 152, as shown in FIG. 6 (a)-(e).

When a 1 V bias was applied to the graphene optoelectronic detector of the present embodiment, blue light (405 nm, 68 mW) was applied onto the graphene optoelectronic detector and a current detector (not shown in the figure) was used to measure the current change. As shown in FIG. 6(f), a significant reduced current as well as an intense negative photoconductivity can be observed when the blue light was applied at the high-drift carrier moving region of the graphene 12 between the first electrode 151 and the second electrode 152 as shown in FIG. 6(e).

Embodiment 4

Figure 7C:
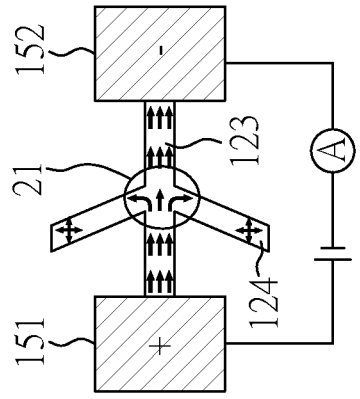
FIG. 7($a$) is a top view of a graphene optoelectronic detector according to Embodiment 3 of the present invention.
Figure 7F:
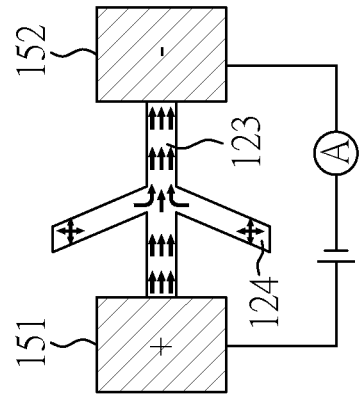
Figure 7B:
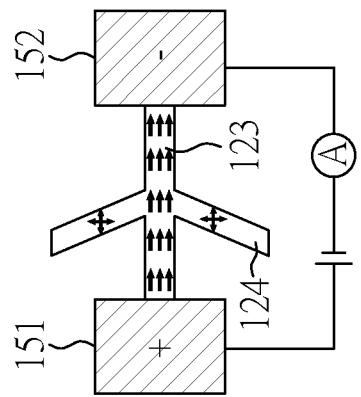
Figure 7E:
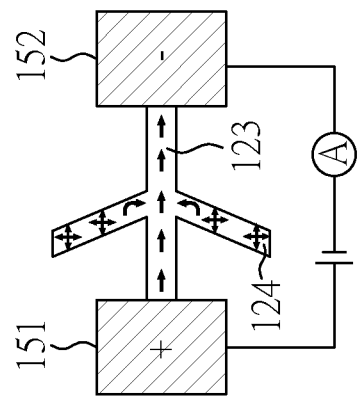
Figure 7A:
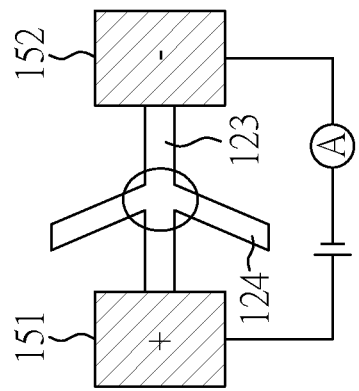

The structure and the manufacturing process of the graphene optoelectronic detector of the present embodiment are similar to those illustrated in Embodiment 1, except that in the graphene optoelectronic detector of the present embodiment, the graphene layer is a patterned graphene layer, which comprises: a connection portion 123 for connecting the first electrode 151 and the second electrode 152, and at least one lateral extension portion 124, wherein an extension direction of the lateral extension portion 124 intersects a longitudinal direction of the connection portion 123, and a width of the connection portion 123 is smaller than those of the first electrode 151 and the second electrode 152, as shown in FIG. 7(a).

Figure 7D:
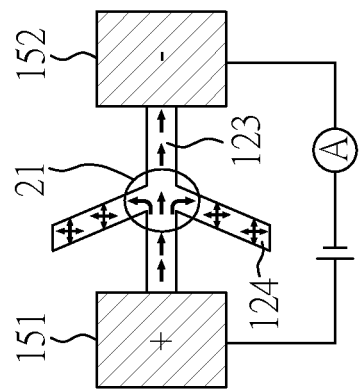

As shown in FIG. 7(b), when a bias is applied to the graphene optoelectronic detector of the present embodiment, the connection portion 123 can be considered as a high-drift carrier moving region, and the lateral extension portion 124 can be considered as a low-drift carrier moving region. As shown in FIG. 7(c), when a photonic and electromagnetic energy 21 is applied onto the connection portion 123, the charge carries on the connection portion 123 may scatter to the lateral extension portion 124, as shown in FIG. 7(d). In this case, a current change can be observed. When the photonic and electromagnetic energy 21 is removed, the charge carriers scattering to the lateral extension portion 124 may gradually return to the connection portion 123, as shown in FIG. 7(e); and then recover to the situation that the photonic and electromagnetic energy 21 is not applied thereon, forming the original high-drift carrier moving region, as shown in FIG. 7(f). In other embodiments of the present invention, the shape of the lateral extension portion 124 is not particularly limited to the shape shown in FIG. 7. For example, if two edges of the connection portion 123 for connecting the first electrode 151 and the second electrode 152 are uneven and rough edges, the protrusion portions at the uneven and rough edges can be considered as the low-drift carrier moving region.

Embodiment 5

Figure 8B:
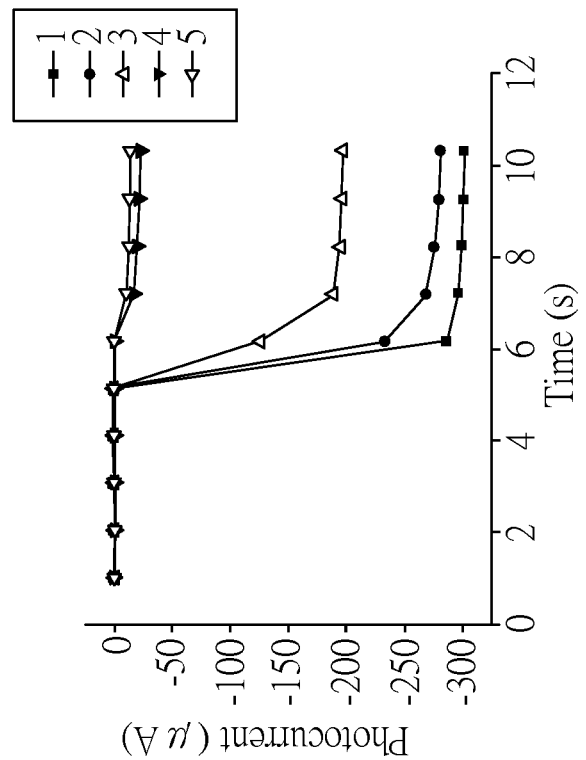
FIG. 8($a$) is a top view of a graphene optoelectronic detector according to Embodiment 4 of the present invention.
Figure 8A:
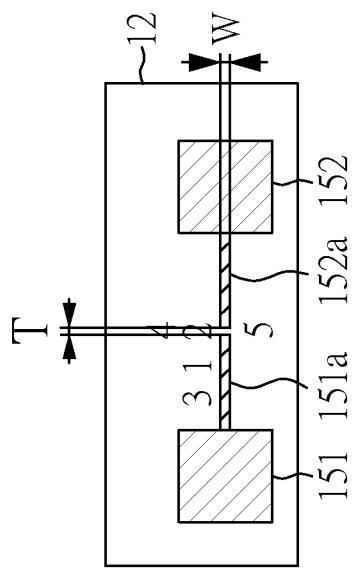

The structure and the manufacturing process of the graphene optoelectronic detector of the present embodiment are similar to those illustrated in Embodiment 1, except that in the graphene optoelectronic detector of the present embodiment, as shown in FIG. 8(a), the first electrode 151 further comprises a first extension portion 151a, the second electrode 152 further comprises a second extension portion 152a, the first extension portion 151a extends from the first electrode 151 toward the second electrode 152, the second extension portion 152a extends from the second electrode 152 toward the first electrode 151, and the predetermined distance T is between the first extension portion 151a and the second extension portion 152a. In the present embodiment, the widths W of the first extension portion 151a and the second extension portion 152a are respectively 40 μm, and the distance T therebetween is 20 μm. However, in other embodiments of the present invention, the distance between the first extension portion 151a and the second extension portion 152a is not limited to the aforementioned range, and can be in a range from 1 μm to 100 μm.

When a 1 V bias was applied to the graphene optoelectronic detector of the present embodiment, blue light (405 nm, 68 mW) was applied onto the graphene optoelectronic detector and a current detector (not shown in the figure) was used to measure the current change. On the basis of the positions indicated in FIG. 8(a), when the blue light was applied on the position indicated by 1, the photocurrent response gain was about 7%. Compared to the graphene optoelectronic detector of Embodiment 1, the sizes of the electrodes in the graphene optoelectronic detector of the present embodiment are reduced, resulting in the reduced dark current and increased photocurrent response gain.

Although the present invention has been explained in relation to its preferred embodiment, it is to be understood that many other possible modifications and variations can be made without departing from the spirit and scope of the invention as hereinafter claimed.

What is claimed is:

1. A method for detecting photonic and electromagnetic energy, comprising the following steps:
  providing a graphene optoelectronic detector, comprising:
    an insulating substrate with a graphene layer disposed thereon;
    a first electrode disposed on the graphene layer or between the graphene layer and the insulating substrate; and
    a second electrode disposed on the graphene layer or between the graphene layer and the insulating substrate, wherein there is a predetermined distance between the first electrode and the second electrode, and the first electrode and the second electrode are at different electrical potentials,
  wherein a high-drift carrier moving region is disposed between the first electrode and the second electrode, and a low-drift carrier moving region is disposed outside the high-drift carrier moving region,
  applying photonic and electromagnetic energy onto the high-drift carrier moving region, wherein charge carriers in the high-drift carrier moving region scatter to the low-drift carrier moving region to obtain a decreased current value between the first electrode and the second electrode; and
  detecting and calculating the decreased current value to obtain an amount of the photonic and electromagnetic energy.

2. The method as claimed in claim 1, wherein the photonic and electromagnetic energy is infrared, visible light, UV light, electromagnetic radiation, extreme UV light, high-level radiation, or magnetic field.

3. The method as claimed in claim 1, wherein the predetermined distance is in a range from 1 μm to 1000 μm.

4. The method as claimed in claim 1, wherein the graphene layer is a monolayer graphene layer.

5. The method as claimed in claim 1, wherein the graphene layer is a stack of multiple layers of monolayer graphene.

6. The method as claimed in claim 1, wherein the first electrode further comprises a first extension portion, the second electrode further comprises a second extension portion, the first extension portion extends from the first electrode toward the second electrode, the second extension portion extends from the second electrode toward the first electrode, and the predetermined distance is between the first extension portion and the second extension portion.

7. The method as claimed in claim 6, wherein the predetermined distance is in a range from 1 μm to 1000 μm.

8. The method as claimed in claim 1, wherein the graphene layer is a patterned graphene layer, which comprises: a connection portion for connecting the first electrode and the second electrode, and at least one lateral extension portion, wherein an extension direction of the lateral extension portion intersects a longitudinal direction of the connection portion, and a width of the connection portion is smaller than those of the first electrode and the second electrode.

9. The method as claimed in claim 1, wherein at least one recess is further disposed in the graphene layer, which locates around the first electrode and the second electrode but does not locate on the high-drift carrier moving region between the first electrode and the second electrode.

10. A graphene optoelectronic detector, comprising:
an insulating substrate with a graphene layer disposed thereon;
a first electrode disposed on the graphene layer or between the graphene layer and the insulating substrate; and
a second electrode disposed on the graphene layer or between the graphene layer and the insulating substrate, wherein there is a predetermined distance between the first electrode and the second electrode, and the first electrode and the second electrode is electronegativity,
wherein a high-drift carrier moving region is disposed between the first electrode and the second electrode, and a low-drift carrier moving region is disposed outside the high-drift carrier moving region, and
wherein, when photonic and electromagnetic energy is applied onto the high-drift carrier moving region, charge carriers in the high-drift carrier moving region scatter to the low-drift carrier moving region to obtain a decreased current value between the first electrode and the second electrode, and an amount of the photonic and electromagnetic energy is obtained by detecting and calculating the decreased current value.

11. The graphene optoelectronic detector as claimed in claim 10, wherein the photonic and electromagnetic energy is infrared, visible light, UV light, electromagnetic radiation, extreme UV light, high-level radiation, or magnetic field.

12. The graphene optoelectronic detector as claimed in claim 10, wherein the predetermined distance is in a range from 1 μm to 1000 μm.

13. The graphene optoelectronic detector as claimed in claim 10, the graphene layer is a monolayer graphene layer or a stack of multiple layers of graphene.

14. The graphene optoelectronic detector as claimed in claim 10, the first electrode further comprises a first extension portion, the second electrode further comprises a second extension portion, the first extension portion extends from the first electrode toward the second electrode, the second extension portion extends from the second electrode toward the first electrode, and the predetermined distance is between the first extension portion and the second extension portion.

15. The graphene optoelectronic detector as claimed in claim 14, wherein the predetermined distance is in a range from 1 μm to 1000 μm.

16. The graphene optoelectronic detector as claimed in claim 10, wherein the graphene layer in the high-drift carrier moving region further comprises: a connection portion for connecting the first electrode and the second electrode, and at least one lateral extension portion, wherein an extension direction of the lateral extension portion intersects a longitudinal direction of the connection portion, and a width of the connection portion is smaller than those of the first electrode and the second electrode.

17. The graphene optoelectronic detector as claimed in claim 10, wherein at least one recess is further disposed in the graphene layer, which locates around the first electrode and the second electrode but does not locate on the high-drift carrier moving region between the first electrode and the second electrode.

* * * * *